United States Patent [19]
Oshima

[11] Patent Number: 4,962,287
[45] Date of Patent: Oct. 9, 1990

[54] FLEXIBLE PRINTED WIRE BOARD

[75] Inventor: Nobuyuki Oshima, Ishinomaki, Japan

[73] Assignee: Alps Electric Co., Ltd., Tokyo, Japan

[21] Appl. No.: 312,014

[22] Filed: Feb. 16, 1989

[30] Foreign Application Priority Data

Apr. 14, 1988 [JP] Japan .............................. 63-50401[U]

[51] Int. Cl.⁵ ............................................ H05K 1/00
[52] U.S. Cl. ................................... 174/261; 361/398; 361/410
[58] Field of Search ............... 174/68.5, 261; 361/397, 361/398, 409, 410

[56]  References Cited

U.S. PATENT DOCUMENTS

| | | | |
|---|---|---|---|
| 3,461,436 | 8/1969 | Navon et al. | 174/68.5 |
| 4,287,394 | 9/1981 | Hargita et al. | 174/68.5 X |
| 4,426,548 | 1/1984 | Oritsuki et al. | 361/410 X |
| 4,551,789 | 11/1985 | Schettler et al. | 174/68.5 X |

FOREIGN PATENT DOCUMENTS 1386344  3/1975  United Kingdom ................. 174/261

OTHER PUBLICATIONS

Hunter, L. P.; "Repairing Aluminum Integrated Circuit Wiring"; IBM Technical Disclosure Bulletin; vol. 7, No. 10; Mar. 65; p. 855.

Primary Examiner—Morris H. Nimmo
Attorney, Agent, or Firm—Guy W. Shoup; Paul J. Winters

[57] ABSTRACT

A flexible printed wire board is provided with the wiring pattern formed on the flexible film, a part of the conductive pattern is coated as the insulating layer including a number of the layer stacked in turns to each other and forms the lower conductive patterns, at least one pair of the connected pattern and the crossover pattern are connected to each other, and the outer pattern of the upper layer on the insulating layer is placed toward the inward of the lower layer, thereby preventing the crossover pattern from being made thin extremely and assuring the reliability.

9 Claims, 2 Drawing Sheets

FLEXIBLE PRINTED WIRE BOARD

FIELD OF THE INVENTION

This invention relates to crossover conductors or wires in a flexible printed wire board.

BACKGROUND OF THE INVENTION

In a printed wire board including a flexible printed wire board, conventional crossover wiring methods as shown in FIG. 3A and B have been widely used. The materials of construction are generally similar to the materials used in, prior art, U.S. Pat. No. 4,287,394 (Hargita et al.). As part of these configurations insulation 5' is printed/formed on a desirable part of a wiring pattern 2, 3, 4. The wiring pattern 2, 3, 4 is printed by etching copper film or conductive paste which has been placed on a flexible or hard substrate 1. A crossover wiring pattern 10 is printed/formed over the insulating layers 6, 7, 8 (collectively 5') which cover a lower wire 2 of the wiring pattern 2, 3, 4. The crossover wiring pattern 10 connects two terminals (end or connecting portions)/wires 3a, 4a/3, 4 of the connected conductive/wiring pattern 2, 3, 4 on the surface of the substrate 1 across the insulation 5' covering the lower wire 2. In order to obtain the good insulation between the lower conductive/wiring pattern (wire) 2 and the crossover conductive/wiring pattern 10 it is necessary to have an insulating film 5' of a relatively thick predetermined thickness. Because the predetermined thickness cannot be obtained by the application of a single insulation layer, the required predetermined thickness of insulation 5' is obtained by repeating the insulation application procedure two to three times stacking the insulation layers 6, 7, 8 on top of each other. This stacking has been performed conveniently and easily by repeating the insulation application procedure using the same pattern mask several times.

But the above conventional crossover technique has problems because a step is formed at the edge of the crossover insulation between the top of the uppermost insulating pattern layer 8, and the surface of the substrate and the surface of the terminals/wires 3a, 4a/3, 4. This step is relatively large. The crossover wiring pattern 10 is printed/formed across this relatively large step. After the conductive/wiring pattern 10 has been printed/formed it is often found to be disconnected at the point where the wiring pattern crosses the step. Or, even if the wiring pattern 10 across the step is not immediately disconnected, the thickness of the crossover conductive/wiring pattern 10 applied across the step is thin and the conductive/wiring pattern 10 crossing the step is often disconnected during handling, and therefore the reliability of the connection across the step has been poor. These problems also appear in the flexible printed circuit boards where the substrate 1 itself is bent often.

SUMMARY OF INVENTION

The object of the present invention is to provide a flexible printed circuit board having a high reliability without the fear of disconnection. The present invention comprises a flexible printed insulating wire board with a conductive/wiring pattern formed on the flexible board/film, part of the conductive pattern is coated with an insulating layer. The materials of construction are generally similar to those described in the prior art above. The insulation coated portion of the conductive/wiring pattern forms a lower conductive/wiring pattern. Insulation covers a portion of the lower conductive/wiring pattern to provide a crossover location for a crossover conductive/wiring pattern. The crossover conductive/wiring pattern connects at least one pair of wires of the conductive/wiring pattern to each other across the insulation over the lower conductive/wiring pattern. The insulation is applied in several layers, however unlike the prior art, the same insulation mask is not used for each layer. At the edge of the insulation the mask pattern for each successively applied insulation layer overlaps the previous one partially and has a smaller area than the previous layer such that the edge of each insulation layer forms a step in what appears to be a set of stairs where the bottom landing coincides with the substrate or the conductive/wiring pattern formed on the substrate and the top step is the top of the top insulation layer. When a hole is formed in the insulation to provide access to a connection on the substrate then the edges of the insulation layers are stepped from both inside and outside the hole. The present invention provides the above configuration, so that the insulation pattern layers form a cross section which is smoothly slanted, so that when the crossover conductive/wiring pattern is printed/formed it is not disconnected by a tall step. The smooth transition between insulation layers prevents the crossover conductive/wiring/film from becoming extremely thin, thereby assuring reliability for a long period of time.

BRIEF DESCRIPTION OF DRAWINGS

The foregoing and other features and advantages of the invention will be apparent from the following more particular description of the preferred embodiments of the invention and as illustrated in the accompanying drawings.

FIG. 1A is a plan view and FIG. 1B is a central cross sectional view of FIG. 1A;

FIG. 2A is a plan view and FIG. 2B is a central cross sectional view of FIG. 2A.;

FIG. 3A is a plan view and FIG. 3B is a central cross sectional view of FIG. 3A.

DETAILED DESCRIPTION OF THE PREFERRED EMBODIMENTS

Figure 1A:
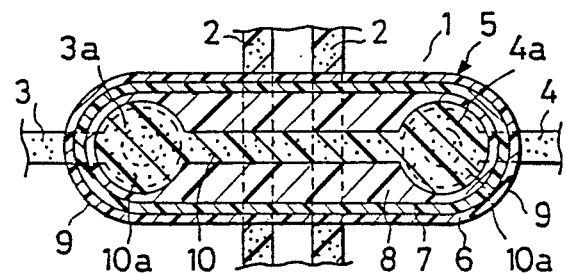
FIGS 1A and 1B show one embodiment of the flexible printed circuit board according to the present invention.
Figure 1B:
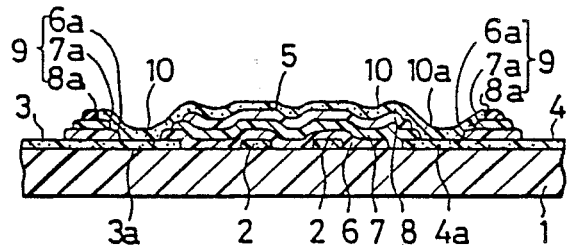

In FIGS. 1A & 1B, a flexible substrate 1 has a wiring pattern (2, 3, 4) printed/formed thereon. A lower conductive/wiring pattern 2 is coated by an insulation 5. A connected conductive/wiring pattern having wires 3 and 4 spaced and insulated in a plane from the lower conductive/wiring pattern 2 is a part of the wiring pattern. End portions(terminals) 3a and 4a of connected conductive/wiring patterns 3 and 4 are the portions connected with the crossover pattern 10 and have enough area to perform reliably. An insulation 5 is comprised of three layers, in which first insulating layer 6, second insulating layer 7 and third insulating layer 8 are in turn stacked on each other, and are printed/formed to coat said lower conductive/wiring pattern 2. These insulating layers 6, 7, 8 have holes 6a, 7a, 8a formed respectively therein at places where the connection portions 3a and 4a of connected conductive/wiring patterns 3 and 4 are exposed. Collectively these holes 6a, 7a, 8a form a perforation 9 of the insulation 5. Thus, the edge pattern of each successive insulating layer is offset from the one below it by 0.2mm, between two insulation layers that is, a width of 0.2mm of the edges of the lower insulation layer can be observed after the upper insulation layer is applied. Also, the holes 6a, 7a, 8a in each layer of insulation 5 are successively widened by 0.2mm respectively. Accordingly, the insulation 5 has a slanted surface, which is smoothly thickened with increasing distance away from the insulation's edges. A crossover wiring pattern 10, connects both crossover portions 10a together. Each crossover portion 10a is connected with a connecting portion 3a and 4a of the connected conductive/wiring patterns 3 and 4. Also, the crossover portion 10a at the center of the insulation 5 is printed/formed to be placed on connecting portions 3a and 4a of connected conductive/wiring patterns 3 and 4. Thus, as described above, the edges of the perforations 9 on the insulation 5 is a surface smoothly formed and slanted towards the local medial axis (varied insulation patterns have areas where the edge patterns converge and diverge from adjoining edges, points which are approximately equidistant from each adjoining edge form a local medial axis) of the pattern, so that the crossover pattern 10 traversing each of the edges is not extremely thin at the edges of the insulation 5 and the crossover conductor/wire/film 10 thickness at these edges is sufficient to assure that reliability is obtained. Also, conventional flexible circuit boards have often experienced failures. These failures result from the fact that the insulation 5' uses the same full mask pattern for applying the lower insulation layer 6 as it uses for applying the upper insulation layer 8 and thus the mechanical stiffness of the insulation 5' is high and as a result the insulation 5' does not bend easily; when the flexible printed circuit was bent, the insulation 5' separated from the substrate and as a result the lower conductive/wiring patterns or the connected conductive/wiring patterns were disconnected. Contrasted with the flexible printed circuit board of the present invention which is formed so that the upper layers 7, 8 of the insulation 5 have a reduced mask pattern area wherein the thickness of the insulation 5 increases towards the local medial axis of the pattern of the insulation. Whereby the insulation 5 is not and the inconvenience described above is avoided.

Figure 2A:
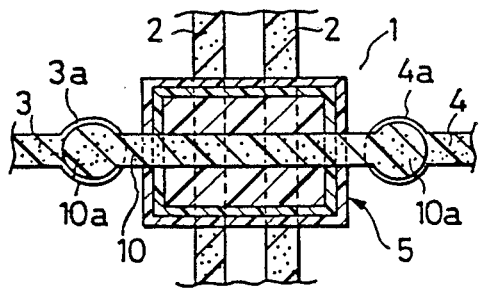
FIG. 2A and 2B show a second embodiment of the present invention.
Figure 2B:
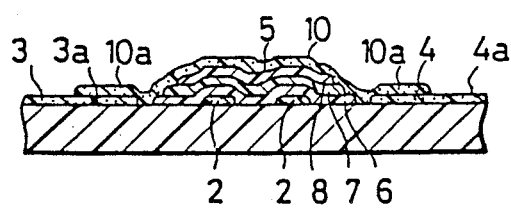
Figure 3A:
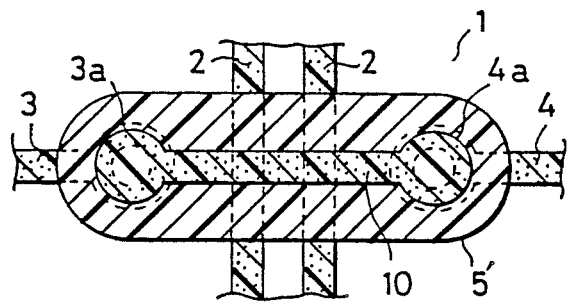
FIG. 3A and 3B show the flexible printed circuit board of the prior art.
Figure 3B:
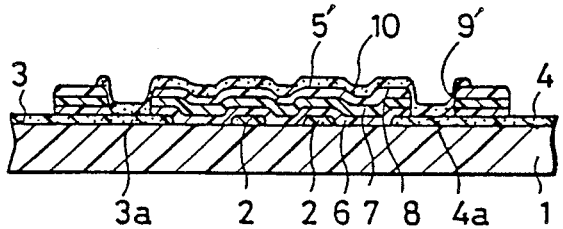

FIG. 2 shows a second embodiment of the present invention. This embodiment is different from the first embodiment in that the perforations 9 are not designed within the insulation 5, and the crossover pattern 10 and the connected conductive/wiring pattern 3, 4 are connected to each other outside of the boundaries of the insulation 5. The actual effect of this configuration is the same as that of the first embodiment.

The first embodiment has insulation which is applied in three layers 6, 7, 8, but the number of layers may be modified according to the amount of insulation 5 required. As described above, the present invention is a flexible printed wire board provided with a wiring pattern 2, 3, 4 formed on the flexible board/film 1, in which a part of the conductive/wiring pattern is coated with a number of overlapping insulating layers 6, 7, 8 to form a lower conductive/wiring pattern 2, at least one pair of wires of the connected conductive/wiring pattern 3, 4 which are spaced and insulated from the lower conductive/wiring pattern 2, are connected across the lower conductive/wiring pattern 2 by a crossover conductor/wiring pattern 10 formed on the insulation 5. At the step edge of the insulation 5, the edges of each succeedingly lower insulation layer stickout beyond the insulation layer immediately above it by a predetermined amount, thereby forming steps which provide a smooth transition from the top insulation layer 8 to the substrate 1 or an end portion of a conductive/wiring pattern 3, 4 on the substrate adjacent to the lowest insulation layer 6. Whereby the crossover conductive/wiring pattern 10 traversing each of the edges does not become extremely thin even at the edges, and it is possible to obtain a crossover conductor/wire/film 10 thickness sufficient to assure that reliability is maintained.

What is claimed is:

1. A flexible printed wire board comprising:
   a flexible film;
   a wiring pattern having a first, a second, and a third conductive pattern formed on the flexible film;
   an insulation coating, wherein a part of the first conductive pattern is coated with the insulation coating which is comprised of a plurality of overlapping layers of insulation which cover the first conductive pattern at a crossover point, said second and third conductive patterns are spaced and insulated from the first conductive pattern; and
   a crossover pattern formed on the insulation coating traversing the first conductive pattern connecting said second and said third conductive patterns, said plurality of overlapping layers of insulation are so configured that between any two layers stacked one upon the other, a top layer stacked on a bottom layer each having a layer edge, a top surface of said bottom layer is exposed from said bottom layer edge for a predetermined distance along said top surface of said bottom layer to the layer edge of said top layer, at which point said top layer is disposed on said bottom layer.

2. A flexible printed wire board as claimed in claim 1, wherein the insulation coating is provided with holes formed therein exposing portions of said second and third conductive patterns at predetermined locations, wherein said top surface of said bottom layer is exposed from said bottom layer edge for a predetermined distance along said top surface of said bottom layer to the layer edge of said top layer, which causes the holes formed in the insulation coating to be enlarged by each succeeding insulation layer.

3. A flexible printed wire board as claimed in claim 1, wherein said second and third conductive patterns and the crossover pattern connecting across the insulation coating are connected at points outside a perimeter edge of said insulation coating.

4. A flexible printed wire board comprising:
   a pair of conductive patterns;
   a third conductive pattern disposed between said pair of conductive patterns;
   a flexible insulating substrate on which said pair of patterns and said third conductive pattern are mounted, said substrate having a top surface;
   an insulating layer disposed over said third conductive pattern; and
   a crossover conductive pattern disposed on said insulating layer, said crossover conductive pattern providing an electrical connection between each conductive pattern of said pair of conductive patterns, said insulating layer comprising at least two layers, an upper layer and a lower layer each having an edge and each having a top surface, wherein said upper layer is disposed on said lower layer, said lower layer being closer to said top surface of said substrate than said upper layer, and the top surface of said lower layer adjacent to said edge of said lower layer is exposed such that at least two steps in a stair-like structure are formed which are traversed by said crossover conductive pattern in connecting between the top of said substrate and the top of said upper insulation layer, the thickness of each step being approximately equal to the thickness of each insulation layer.

5. A flexible printed wire board comprising:
a flexible film;
a wiring pattern having a first, a second, and a third conductive pattern formed on said flexible film, wherein a crossover point is defined at a location where an electrical connection is to be made only between said second and third conductive patterns across said first conductive pattern;
an insulation coating formed on said film, which covers said first conductive pattern at said crossover point, said coating comprising a plurality of overlapping insulation layers, each layer having an edge which forms a step in a stair-like edge pattern of the insulation coating, the stair-like edge pattern starting at said film and ending at a top most insulation layer of said insulation coating; and
a crossover pattern electrically connecting said second and said third conductive patterns across said insulation coating at said crossover point, wherein the stair-like edge of the insulation coating forms a smooth transitional surface from said film to the top of said insulation coating across which a portion of said crossover pattern is formed.

6. A flexible printed wire board as claimed in claim 5, wherein said insulation coating is also formed on a portion of said second and said third conductive patterns, wherein the stair-like insulation coating edge pattern also starts at a top surface of said second and said third conductive patterns, and wherein the stair-like edges of the insulation coating also form a smooth transitional surface from said second and said third conductive patterns to the top of said insulation coating across which a portion of the crossover pattern is formed.

7. A flexible printed wire board comprising:
an insulation coating having a top surface, said coating formed on the printed wire board; and
a wiring pattern formed on the printed wire board which provides a connection between a point adjacent to said insulation coating on said printed wire board to a point on said top surface of said insulation coating, wherein the insulation coating is comprised of at least two overlapping layers, each having a layer edge which collectively form a coating edge for said insulation coating, across which said wiring pattern is formed, at said coating edge said at least two layers being so configured that between any two layers, a top layer disposed on a bottom layer, a top surface of said bottom layer is exposed from said layer edge of said bottom layer for a predetermined distance along said top surface of said bottom layer to the layer edge of said top layer, at which point said top layer is disposed on said bottom layer.

8. A flexible printed wire board as claimed in claim 7, wherein said insulation coating is provided with holes formed therein at predetermined points, to connect a point on the surface of the board in the hole with said top surface of said insulation coating, wherein the perimeter of the hole defines said coating edge across which said connection is formed.

9. A flexible printed wire board as claimed in claim 7, wherein said insulation coating is provided with holes formed therein at predetermined points, to connect a point on the surface of the board in the hole with said top surface of said insulation coating, wherein the perimeter of the hole defines said coating edge across a portion of which said connection is formed.

* * * * *

UNITED STATES PATENT AND TRADEMARK OFFICE
CERTIFICATE OF CORRECTION

PATENT NO. : 4,962,287
DATED : October 9, 1990
INVENTOR(S) : Nobuyuki Oshima

It is certified that error appears in the above-identified patent and that said Letters Patent is hereby corrected as shown below:

Title page:

Abstract should read:

--A flexible printed wire board is provided with a wiring pattern formed on the flexible wire board. A part of the conductive/wiring pattern is coated with an insulation coating having a number of layers overlappingly stacked on top of each other. At least one pair of wires in the wiring pattern are connected to each other across the insulation coating in a crossover wiring pattern. The insulation layers are formed so that a smooth transition is formed at the edge of the insulation coating between the wire board and the top insulation layer at the edge of the insulation coating. The lower insulation layers stick out beyond upper layer in a stair-like fashion to form this smooth transition thereby preventing the formation of extremely thin areas in the crossover wiring pattern which break as soon as the formation of the wiring pattern is complete or soon thereafter, but rather forms a wiring pattern having a relatively uniform cross section in a crossover thereby assuring reliability.--

Signed and Sealed this

Second Day of April, 1991

*Attest:*

HARRY F. MANBECK, JR.

*Attesting Officer*   *Commissioner of Patents and Trademarks*